US008081081B2

(12) United States Patent
Kobayashi et al.

(10) Patent No.: US 8,081,081 B2
(45) Date of Patent: Dec. 20, 2011

(54) ELECTRONIC APPARATUS AND METHOD OF MANUFACTURING THE SAME

(75) Inventors: Hiroshi Kobayashi, Kawasaki (JP); Kenji Kobae, Kawasaki (JP); Takashi Kubota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 661 days.

(21) Appl. No.: 12/191,539

(22) Filed: Aug. 14, 2008

(65) Prior Publication Data
US 2009/0130393 A1 May 21, 2009

(30) Foreign Application Priority Data
Nov. 21, 2007 (JP) ................. 2007-301869

(51) Int. Cl.
G08B 13/14 (2006.01)
G08B 23/00 (2006.01)
H01L 23/02 (2006.01)
(52) U.S. Cl. ............... 340/572.8; 340/572.1; 340/693.9; 257/678; 257/787
(58) Field of Classification Search .......... None
See application file for complete search history.

(56) References Cited

U.S. PATENT DOCUMENTS
6,333,564 B1 * 12/2001 Katoh et al. .............. 257/780
2006/0180344 A1 8/2006 Ito et al.
2008/0017968 A1 * 1/2008 Choi et al. .............. 257/686
2008/0094169 A1 4/2008 Kinoshita et al.
2008/0278217 A1 * 11/2008 Hankhofer et al. ........... 327/509
2009/0032603 A1 * 2/2009 Takahashi et al. ........... 235/492
2009/0057871 A1 * 3/2009 Zhao et al. ............... 257/693
2009/0121302 A1 * 5/2009 Lin et al. ................. 257/432

FOREIGN PATENT DOCUMENTS
| JP | 2000-200332 A | 7/2000 |
| JP | 2000-227954 A | 8/2000 |
| JP | 2000-311226 A | 11/2000 |
| JP | 2001-351082 A | 12/2001 |
| JP | 2004-110141 A | 4/2004 |
| JP | 2007-140113 A | 6/2007 |
| JP | 2007-227559 A | 9/2007 |
| WO | WO 2006/030705 A1 | 3/2006 |

OTHER PUBLICATIONS

Korean Office Action dated Sep. 29, 2010, issued in corresponding Korean Patent Application No. 10-2008-0107542.
European search report dated Nov. 20, 2008 issued in corresponding European Application No. 08162936.2.

* cited by examiner

*Primary Examiner* — Julie Lieu
(74) *Attorney, Agent, or Firm* — Westerman, Hattori, Daniels & Adrian, LLP

(57) ABSTRACT

The electronic apparatus includes a base sheet; a conductive pattern formed on the base sheet; a circuit chip mounted on the base sheet and connected to the conductive pattern; and plural protrusions arranged on at least one of a frontside and a backside of the base sheet to overlap at least a portion of the conductive pattern. The plural protrusions protrude in a direction away from the base sheet.

14 Claims, 9 Drawing Sheets

ELECTRONIC APPARATUS AND METHOD OF MANUFACTURING THE SAME

BACKGROUND OF THE INVENTION

1. Field of the Invention

The present invention relates to an electronic apparatus and a method of manufacturing the electronic apparatus, and more particularly to an electronic apparatus where a circuit chip is mounted on a base sheet and a method of manufacturing the electronic apparatus.

2. Description of Related Art

Conventionally, electronic apparatus have been widely known where a circuit chip is mounted on a substrate, such as a printed circuit board ("PCB"). Such an electronic apparatus is embedded into an electronic device and mainly used to control the electronic device or exchange information with an external device as a unit. As an example of the electronic apparatus, various types of RFID (Radio Frequency Identification) tags are known, which contactlessly and wirelessly exchange information with an external device represented by a readers/writer. As an example of such RFID tags, an RFID tag including an IC (Integrated Circuit) chip and an antenna pattern mounted on a base sheet, which is a conductive pattern for wireless communication and serves as an antenna, has been proposed (for example, see Japanese Patent Application Publication Nos. 2000-311226, 2000-200332, and 2001-351082). This type of RFID tag is used, for example, to perform identification of a product by exchanging information associated with the product with an external device, while being attached to the product.

One of applications for such an RFID tag is that the RFID tag is attached to a product, such as a garment, which may be subjected to deformation during use. In this application, a bending stress exerted on the RFID tag may cause the antenna pattern to be disconnected, which may lead to a failure of functions as an antenna.

FIG. 1 is a cross sectional view illustrating a conventional RFID tag 10' which has been bent due to a bending stress.

The conventional RFID tag 10' includes a base sheet 111 made of a PET film, a conductive antenna pattern 112 for communication arranged on the base sheet 111, and a circuit chip 12 connected to the antenna pattern 112. The base sheet 111, the antenna pattern 112, and the circuit chip 12 are coated with a rubber coat article 100a. If a bending stress is exerted on the conventional RFID tag 10' in the direction of an arrow shown in FIG. 1, the conventional RFID tag 10' is subject to a bending deformation in this direction following the bending stress. At this time, a large bending stress, which would separate the antenna pattern 112 into two parts, is exerted on an area A' where bending deformation greatly takes place, and therefore, disconnection of the antenna pattern 112 may easily occur in the area A'. This bending stress becomes stronger as the bending angle of the RFID tag 10' increases. Accordingly, the RFID tag 10' that can be excessively bent is liable to be easily disconnected, and thus becomes poor in durability.

Although the above descriptions refer to the case where the conductive pattern serving as an antenna is disconnected, such disconnection of the conductive pattern is not limited only to the RFID tag, but common to all electronic apparatus whose conductive pattern is mounted on the base sheet.

SUMMARY OF THE INVENTION

The present invention has been made in view of the above circumstances and provides an electronic apparatus including:

a base sheet;
a conductive pattern formed on the base sheet;
a circuit chip mounted on the base sheet and connected to the conductive pattern; and
a plurality of protrusions arranged on at least one of a frontside and a backside of the base sheet to overlap at least a portion of the conductive pattern, the plurality of protrusions protruding in a direction away from the base sheet.

The electronic apparatus according to the present invention have plural protrusions arranged over a range of overlapping at least a portion of the range of the conductive pattern. In a case where a bending stress is exerted on the overlapping range, the electronic apparatus exhibit some flexibility corresponding to such a bending stress, but bending angle thereof is suppressed not to exceed a predetermined level by the plural protrusions. Accordingly, the electronic apparatus maintains sufficient flexibility as well as provides high durability since it is difficult for large bending deformation to take place.

In the electronic apparatus according to the present invention, it is preferable that the plurality of protrusions may be higher in rigidity than the base sheet.

According to the present invention, the occurrence of great bending deformation, which could cause damage to the base sheet, may be inhibited thanks to the plural protrusions.

In addition, in the electronic apparatus according to the present invention, the plurality of protrusions may be a plurality of cone-like articles each of which has a bottom surface shaped like a polygon, and which are arranged such that the bottom surfaces are connected to one another.

As used herein, the term "cone-like article" is intended to include a truncated pyramid, such as a truncated triangular pyramid and a truncated quadrangular pyramid, whose tip is flattened, as well as a pyramid, such as a triangular pyramid and a quadrangular pyramid, whose bottom surface is shaped like a polygon. This structure of the cone-like article may permit the electronic apparatus to exhibit a great resistance against a bending stress because the inclined surfaces of the cone-like articles push out each other when the electronic apparatus is bent due to the bending stress exerted on the electronic apparatus.

Further preferably, the electronic apparatus according to the present invention may have a protection body which is broader than the circuit chip and narrower than the conductive pattern, and protects the circuit chip by being disposed on at least one of an upperside of the circuit chip and an underside of the circuit chip where the base sheet is interposed between the circuit chip and the protection body,
wherein the plurality of protrusions are arranged at least on an area of surroundings of the protection body, the area being provided with the conductive pattern.

According to the present invention, the circuit chip itself and its peripheral area may be protected from a bending stress.

Further preferably, the plurality of protrusions may be arranged on both the frontside and backside of the base sheet.

According to the present invention, there are provided electronic apparatus having durability against both a bending stress that makes the base sheet bent toward the outer surface of the base sheet and a bending stress that makes the base sheet bent toward the inner surface of the base sheet.

It is also preferable that a coat article may be provided in which the base sheet, the conductive pattern, the circuit chip, and the protrusions are contained.

According to the present invention, the conductive pattern or circuit chip may be protected from external impacts or moisture.

In addition, in the electronic apparatus according to the present invention, the conductive pattern may constitute an antenna for wireless communication, and the circuit chip performs wireless communication through the antenna.

According to the present invention, an RFID tag may be implemented, which exhibits high durability against a bending stress.

A method of manufacturing an electronic apparatus according to another aspect of the present invention includes the steps of:

mounting a circuit chip on a base sheet on which a conductive pattern is arranged, and connecting the circuit chip to the conductive pattern; and arranging and forming a plurality of protrusions by arranging, in a direction away from the base sheet, the plurality of protrusions on at least one of a frontside and a backside of the base sheet on which the circuit chip is mounted, such that the arranged protrusions overlap at least a portion of the arranged conductive pattern.

In the method of manufacturing the electronic apparatus according to the present invention, electronic apparatus may be manufactured, which have high durability against a bending stress by forming plural protrusions are provided over a range of overlapping at least a portion of a range of the conductive pattern.

Further preferably, in the method of manufacturing the electronic apparatus according to the present invention, the step of arranging and forming the plurality of protrusions may be a step in which a mold having a shape corresponding to a shape of the protrusions is placed on at least one of the frontside and the backside of the base sheet on which the circuit chip is mounted, a liquid material for the protrusions is poured between the base sheet and the mold, and the liquid material is cured, thereby forming the plurality of protrusions.

According to the present invention, the plural protrusions may be simply formed.

As described above, according to the present invention, the electronic apparatus have durability against a bending stress.

DETAILED DESCRIPTION OF THE INVENTION

Hereinafter, exemplary embodiments of the present invention will be described in more detail with reference to accompanying drawings.

Figure 2:
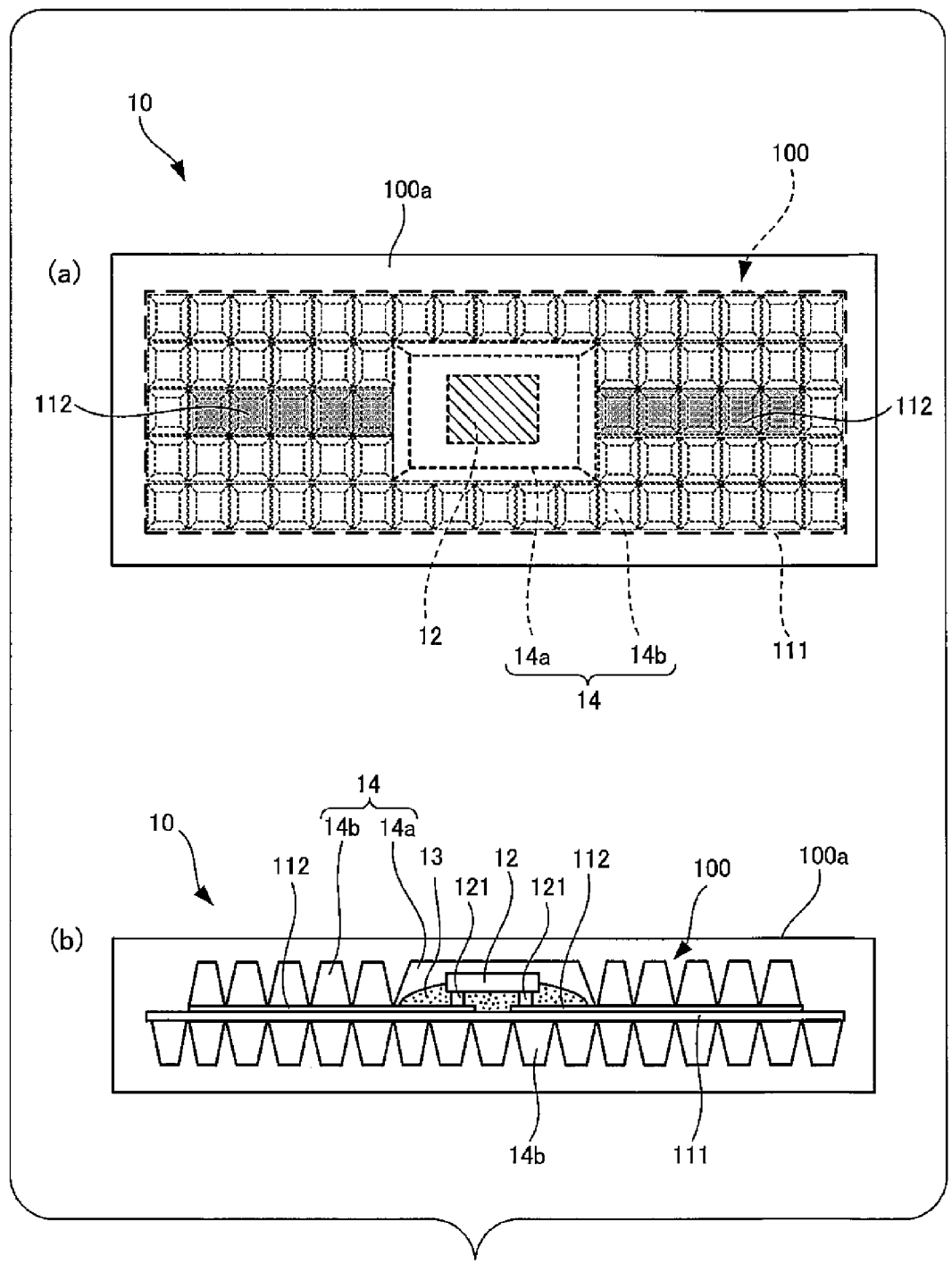
FIG. 2 is a view illustrating an RFID tag that is an exemplary embodiment according to the present invention.

FIG. 2 is a view illustrating an RFID tag 10 that is an exemplary embodiment of the electronic apparatus according to the present invention.

Part (a) of FIG. 2 depicts a plan view of the RFID tag 10 shown in a state in which an inner structure of the RFID tag 10 is seen through, and FIG. 2B depicts a cross sectional view of the RFID tag 10 taken in the longitudinal direction.

It is assumed that the RFID tag 10 shown in FIG. 2 is attached to a product worn by a human, such as a garment, which may be subjected to deformation, and the RFID tag 10 includes an inlay 100 which has a rubber coat article 100a. The inlay 100 includes a base sheet 111, an antenna pattern 112, a circuit chip 12, and a reinforcement body 14. The base sheet 111 is formed of a PET film. The antenna pattern 112 is a conductive pattern for communication, which is formed on the base sheet 111, and serves as an antenna. The circuit chip 12 is electrically connected to the antenna pattern 112 and carries out wireless communication through the antenna pattern 112. The reinforcement body 14 covers both surfaces of the base sheet 111.

As shown in part (b) of FIG. 2, bumps 121 included in the circuit chip 12 are connected to the antenna pattern 112, and current may flow between the circuit chip 12 and the antenna pattern 112 through the bumps 121. The circuit chip 12 is secured to the base sheet 111 by an adhesive 13 as shown in part (b) of FIG. 2. The adhesive 13 is not shown in part (a) of FIG. 2.

The reinforcement body 14 includes plural convex portions arranged on both surfaces of the base sheet 111, each of which is in a shape of a truncated quadrangular pyramid. The reinforcement body 14 consists of a large convex portion 14a that covers the circuit chip 12 and plural small convex portions 14b each of which is smaller in size than the large convex portion 14a. The small convex portions 14b covers the remaining areas except the peripheral area of the circuit chip 12 covered with the large convex portion 14a. The reinforcement body 14 may be made of an electrically insulating material having higher rigidity than that of the base sheet 111. For instance, the reinforcement body 14 may be made of a high-hardness plastic material. In the present invention, a high-hardness ceramic material may be employed for the reinforcement body 14 instead of the plastic material.

The base sheet 111, the antenna pattern 112, the circuit chip 12, the reinforcement body 14, and the coat article 100a correspond to an example of the base sheet, an example of the conductive pattern, an example of the circuit chip, an example of the plural protrusions, and an example of the coat article according to the present invention.

In the RFID tag 10, for example, when a garment is deformed, to which the RFID tag 10 is attached, such a deformation of the garment may affect the circuit chip 12 itself or periphery of the circuit chip 12. However, this deformation may be prevented by covering the periphery of the circuit chip 12 with the large convex portion 14a made of a high-hardness plastic material, as shown in part (b) of FIG. 2. Accordingly, it is possible to prevent damage to the circuit chip 12 itself, the bumps 121 connected to the antenna pattern 112, or a connection part between the circuit chip 12 and the base sheet 111.

Generally, in the RFID tag having a chip reinforcement body that protects the periphery of the circuit chip against a bending stress externally exerted onto the RFID tag, the circuit chip itself and its peripheral area, which are covered with the chip reinforcement body, may be protected from such a bending stress. Instead, the bending stress is prone to concentrate on surroundings of the peripheral area of the circuit chip. At this time, a portion where the bending stress concentrates and therefore a great bending stress is applied may be subjected to disconnection, and thus the RFID chip 10 fails to exhibit sufficient durability.

In the RFID tag 10 shown in FIG. 2, the small convex portion 14b is provided in plurality on both surfaces of the base sheet 111 on the upper surface of which the antenna pattern 112 has been arranged as shown in FIG. 2. The RFID tag 10 may exhibit flexibility against the bending stress thanks to the small convex portion 14b, and the bending stress may be suppressed correspondingly as the bending angle of the RFID tag 10 exceeds a predetermined level. Hereinafter, a structure of the RFID tag 10 will be described.

Figure 3:
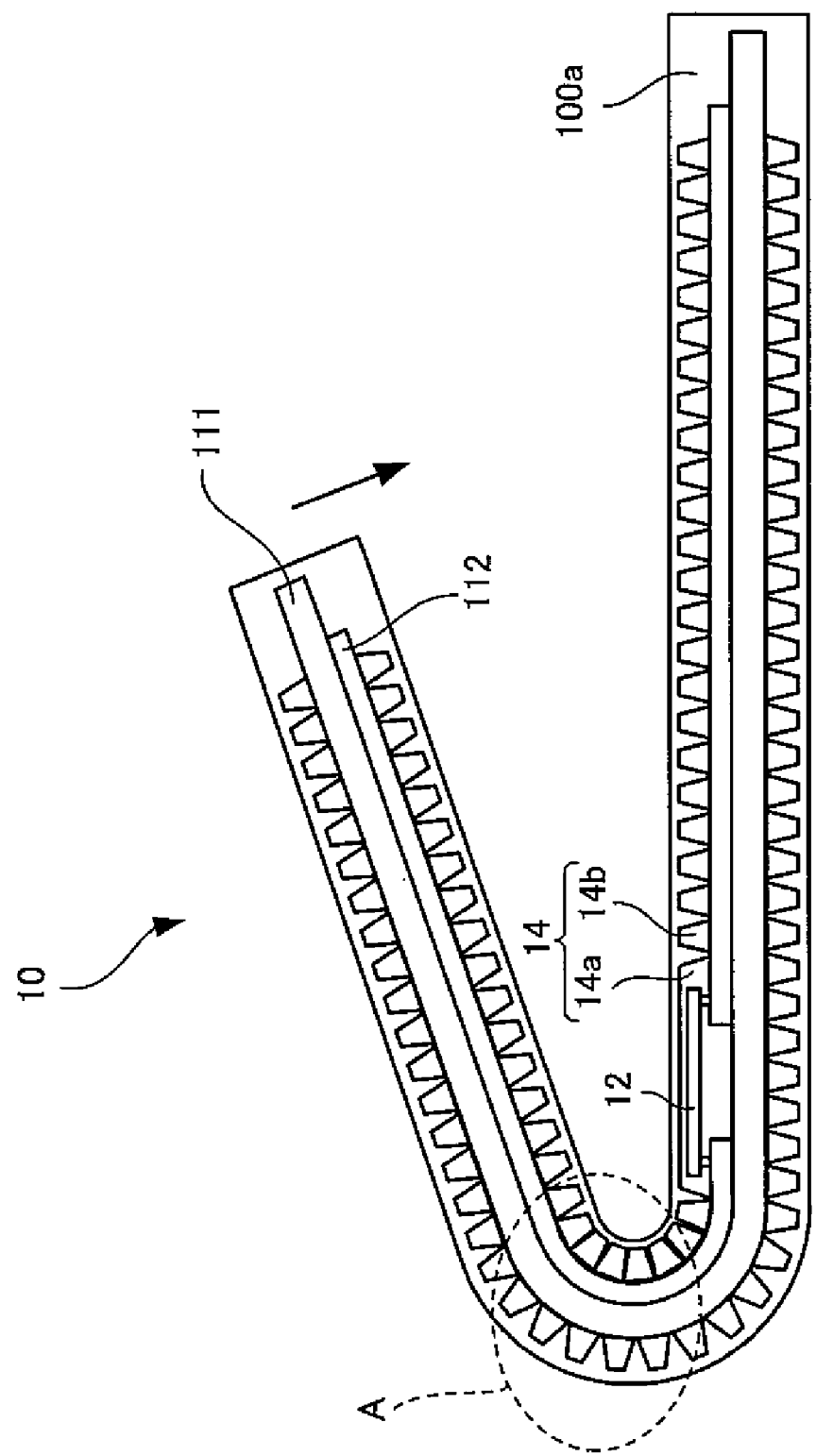
FIG. 3 is a cross sectional view illustrating the RFID tag shown in FIG. 2 which has been bent due to a bending stress.

FIG. 3 is a cross sectional view illustrating an RFID tag 10 shown in FIG. 2 which has been bent due to a bending stress.

As shown in FIG. 3, in the area A which experiences the largest bending deformation, the plural small convex portions 14b arranged at the right side of the base sheet 111 compress the coat article 100a between two neighboring small convex portions 14b, so that inclined surfaces of the truncated quadrangular pyramids become adjacent to each other. Accordingly, the RFID tag 10 is not bent as shown in FIG. 3 despite the bending stress exerted on the RFID tag 10 in the direction of an arrow owing to such small convex portions 14b. As a consequence, the RFID tag 10 shown in FIG. 3 is not subjected to disconnection, and thus yields a high-durability.

Hereinafter, a method of manufacturing the RFID tag 10 shown in FIG. 2 will be described.

Figure 4:
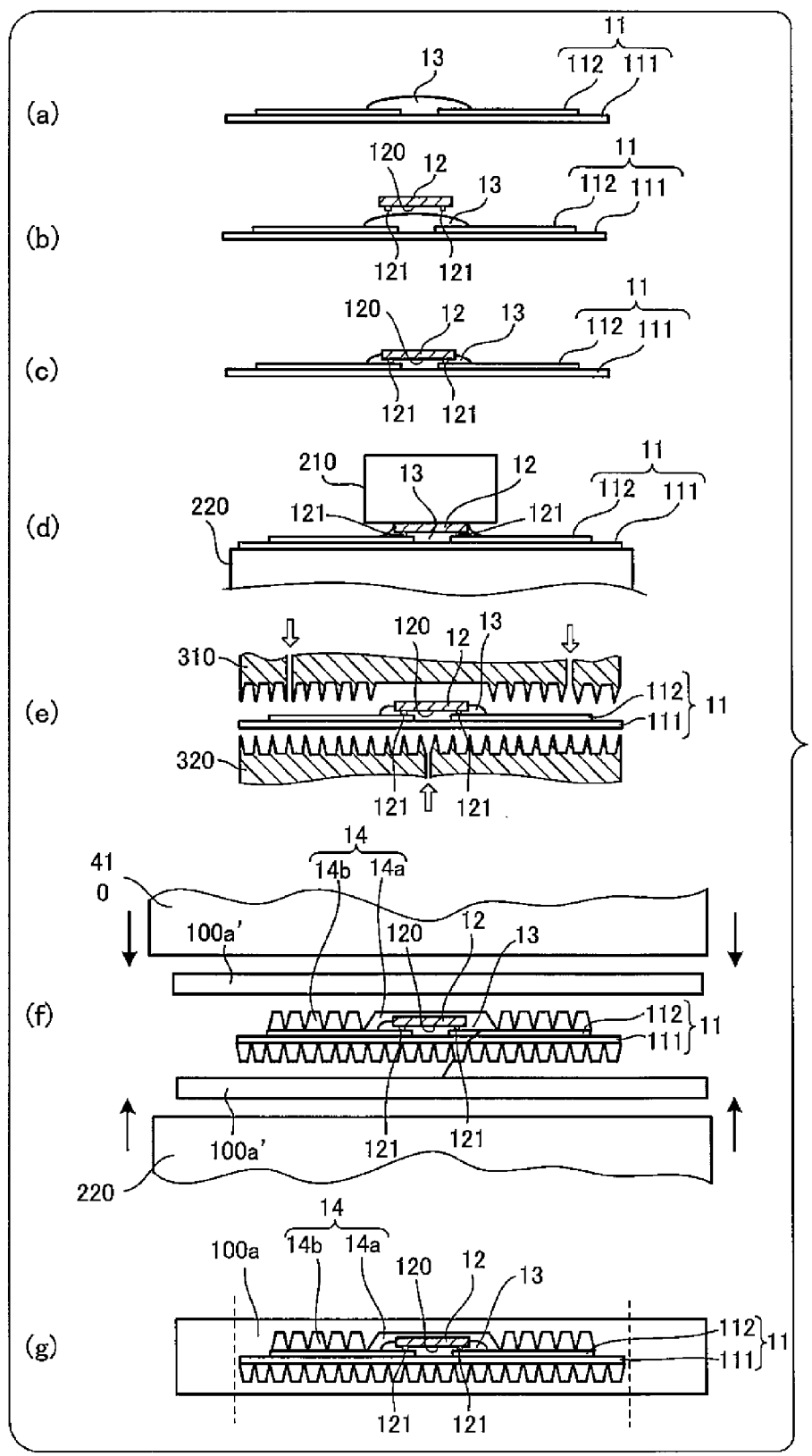
FIG. 4 is a view illustrating a method of manufacturing the RFID tag shown in FIG. 2.

FIG. 4 is a view illustrating a method of manufacturing the RFID tag 10 shown in FIG. 2.

The manufacturing method illustrated in FIG. 4 is an example of the method of manufacturing the RFID tag according to the present invention. Parts (a) to (g) of FIG. 4 sequentially depict each process in the method of manufacturing the RFID tag 10.

Firstly, in part (a) of FIG. 4, a base sheet 111, made of a PET film, on which an antenna pattern 112 is formed, is prepared, and a liquid adhesive 13 is applied on a surface of the base sheet 111 on which the antenna pattern 112 is formed. The liquid adhesive 13 is a heat-curable adhesive that is cured by applying heat.

Next, in parts (b) and (c) of FIG. 4, the circuit chip 12 is mounted on a portion of the base sheet 111 on which the adhesive 13 has been applied, with a circuit surface 120 on which an electronic circuit of the circuit chip 12 is arranged facing the base sheet 111. The circuit chip 12 may be positioned so that bumps 121 formed on the circuit surface 120 of the circuit chip 12 align with the antenna pattern 112 of the base sheet 111.

Then, in part (d) of FIG. 4, the base sheet 111 is placed on a heating stage 220, with the circuit chip 12 mounted on the base sheet 111, and the circuit chip 12 arranged on the base sheet 111 is pressurized toward the heating stage 220 and simultaneously heated by a first heating head 210 having a heater therein. Such heating allows the adhesive 13 to be cured under the circuit chip 12, so that the circuit chip 12 is secured to the base sheet 111.

Subsequently, in part (e) of FIG. 4, the base sheet 111 on which the circuit chip 12 has been mounted is inserted between two molds 310 and 320 for forming the reinforcement body 14 shown in FIG. 2, and then a liquid plastic material for forming the reinforcement body 14 is injected into the base sheet 111 between the two molds 310 and 320 through injection holes bored in the molds 310 and 320 as marked with arrows in FIG. 4. After a predetermined period of time, the plastic material is cooled and cured, and thus the reinforcement body 14 including the large convex portions 14a and the small convex portions 14b is formed on the base sheet 111 as shown in FIG. 2.

Next, in parts (f) and (g) of FIG. 4, the base sheet 111 on which the reinforcement body 14 has been formed is inserted between two sheets of plate-shaped rubber materials 100a' for forming the coat article 100a shown in FIG. 2, and then the rubber materials 100a' are pressurized toward the heating stage 220 and simultaneously heated by a second heating head 410 having its own heater therein. Such heating allows the rubber materials 100a' to be melt so that the melt rubber materials 100a' are drawn into between the large convex portion 14a and the small convex portion 14b, and between the small convex portion 14b and its neighboring small convex portion 14b. The heating is paused a predetermined time after melting, so that the rubber materials 100a' are cured. The cured rubber materials 100' are trimmed by a punching or cutting process, which completes the RFID tag 10 as shown in FIG. 2.

In the method described above, the convex portions shown in FIG. 2 may be formed by pouring a liquid state plastic material in molds between which the base sheet 111 is inserted and curing the liquid state plastic material, and therefore, an RFID tag may be simply manufactured, which has high durability against a bending stress.

Next, an exemplary RFID tag will be described below according to another exemplary embodiment of the present invention.

Figure 5:
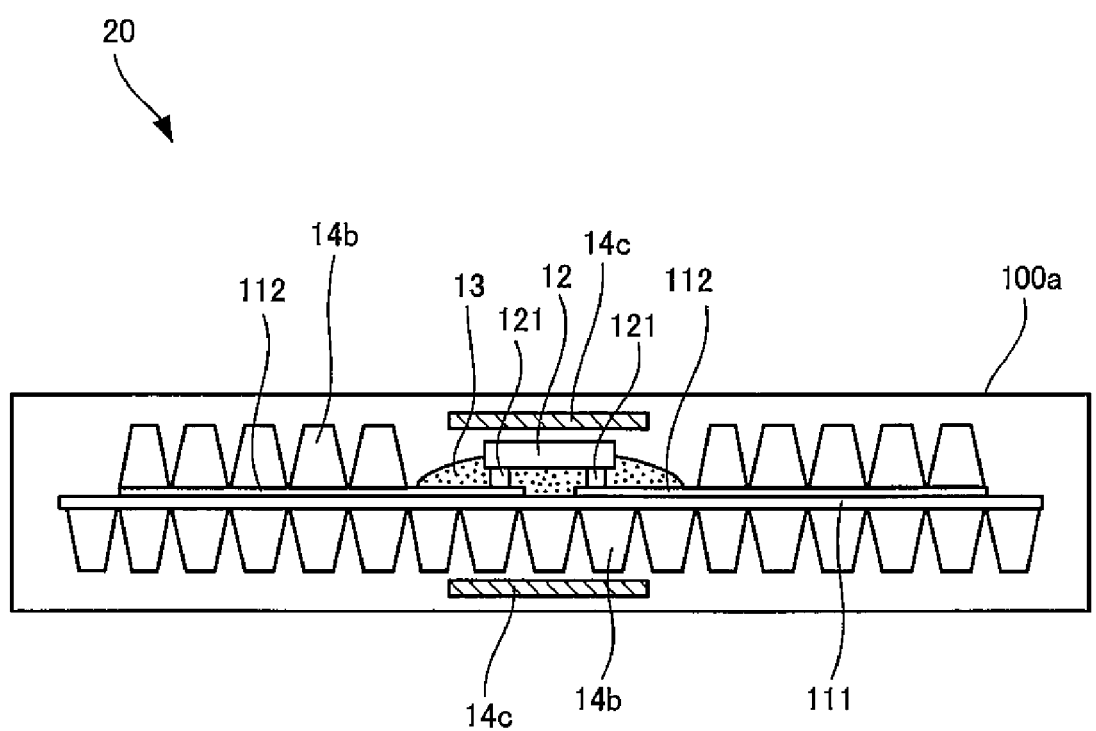
FIG. 5 is a view illustrating an RFID tag according to another exemplary embodiment of the present invention.

FIG. 5 is a view illustrating an RFID tag according to another exemplary embodiment of the present invention.

In FIG. 5, the same components as those of the RFID tag 10 shown in FIG. 2 refer to the same reference characters, and repetitive descriptions will be omitted. FIG. 5 is a cross sectional view illustrating an RFID tag 20 taken in the longitudinal direction according to another exemplary embodiment of the present invention.

It is assumed that the RFID tag 20 shown in FIG. 5 may be also attached to a product, such as a garment worn by a human, which is subjected to deformation. The RFID tag 20 has the same configuration as that of the RFID tag 10 shown in FIG. 2 except that chip reinforcement plates 14c are respectively placed over and under the base sheet 111 mounted with the circuit chip 12, instead of covering the circuit chip 12 with the large convex portion 14a as shown in FIG. 5.

Figure 1:
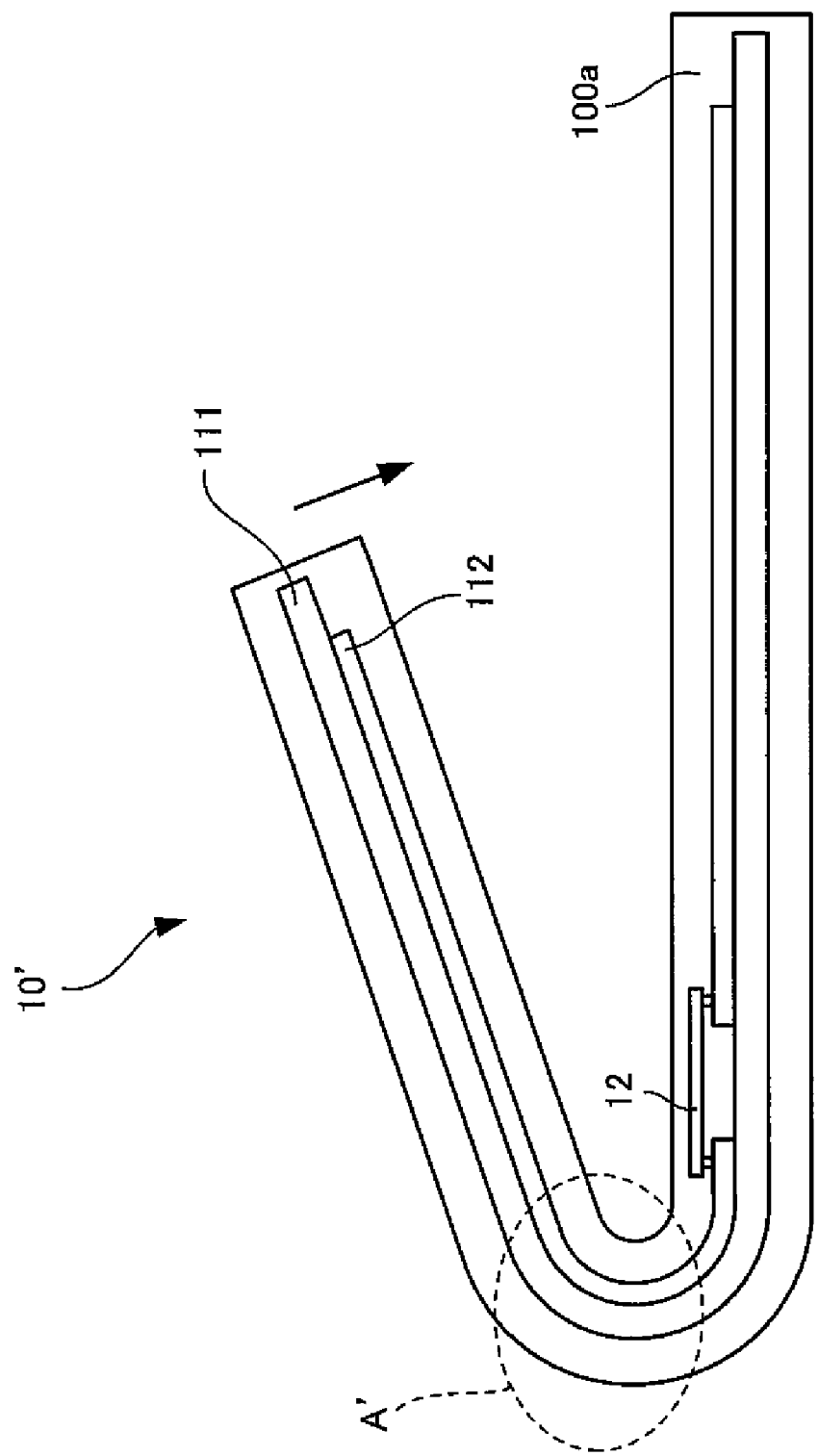
FIG. 1 is a cross sectional view illustrating a conventional RFID tag which has been bent due to a bending stress according to the prior art.

Referring to FIG. 5, the circuit chip 12 of the RFID tag 20 is protected by the two chip reinforcement plates 14c. The small convex portions 14b are provided in the RFID tag 20 shown in FIG. 5, too, and disconnection of the antenna pattern 112 caused by a bending stress is inhibited by the small convex portions 14b as described above with reference to FIG. 3. Accordingly, the RFID tag 20 shown in FIG. 5 seldom experiences disconnection compared to the conventional RFID tag 10' shown in FIG. 1, and thus yields a high-durability.

Hereinafter, a method of manufacturing the RFID tag 20 shown in FIG. 5 will be described.

The RFID tag 20 shown in FIG. 5 undergoes the same process as in parts (a) to (d) of FIG. 4 until the circuit chip 12 is secured to the base sheet 111. Hereinafter, the process after the circuit chip 12 has been secured to the base sheet 111 will be described.

Figure 6:
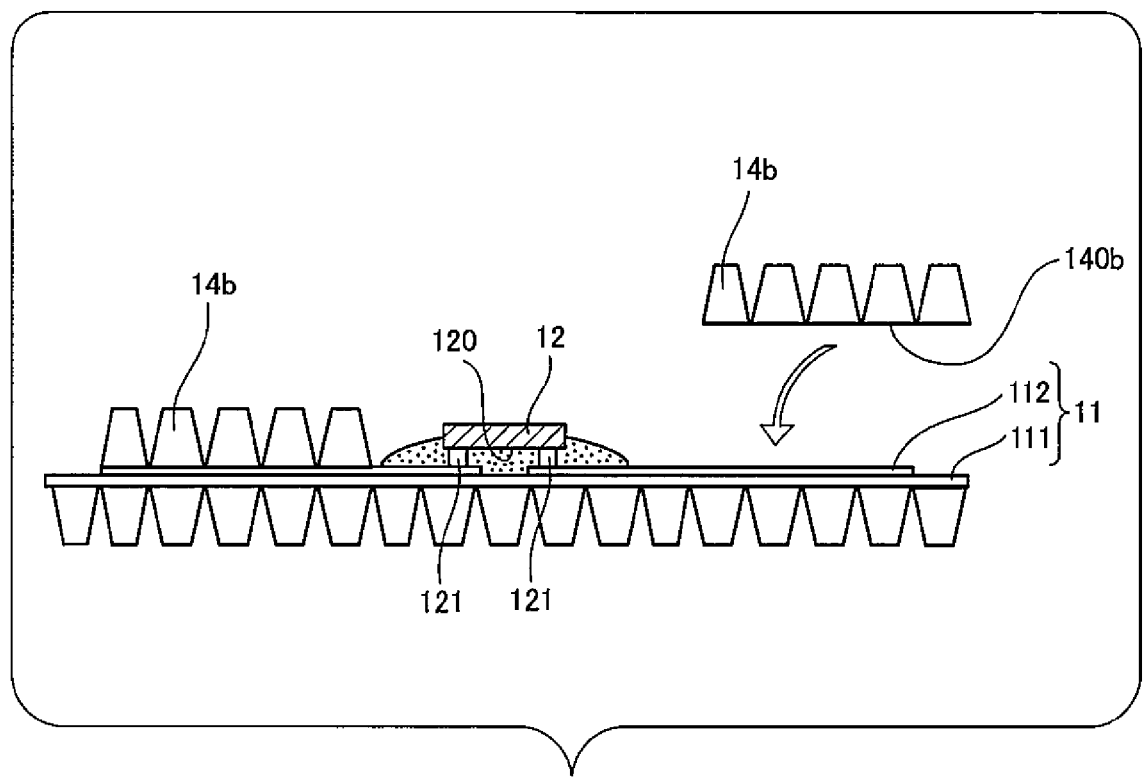
FIG. 6 is a view illustrating a process for forming a small convex portion on a base sheet.

FIG. 6 is a view illustrating a process for forming the small convex portions 14b on the base sheet 111.

In the method of manufacturing the RFID tag 20 shown in FIG. 5, the circuit chip 12 is secured to the base sheet 111, and then the small convex portion 14b which is shaped as a truncated quadrangular pyramid whose bottom surface is attached with a double-sided adhesive tape 140b is attached onto the base sheet 111 as shown in FIG. 6. The attachment of the small convex portion 14b is made on both top surface and bottom surface of the base sheet 111.

Figure 7:
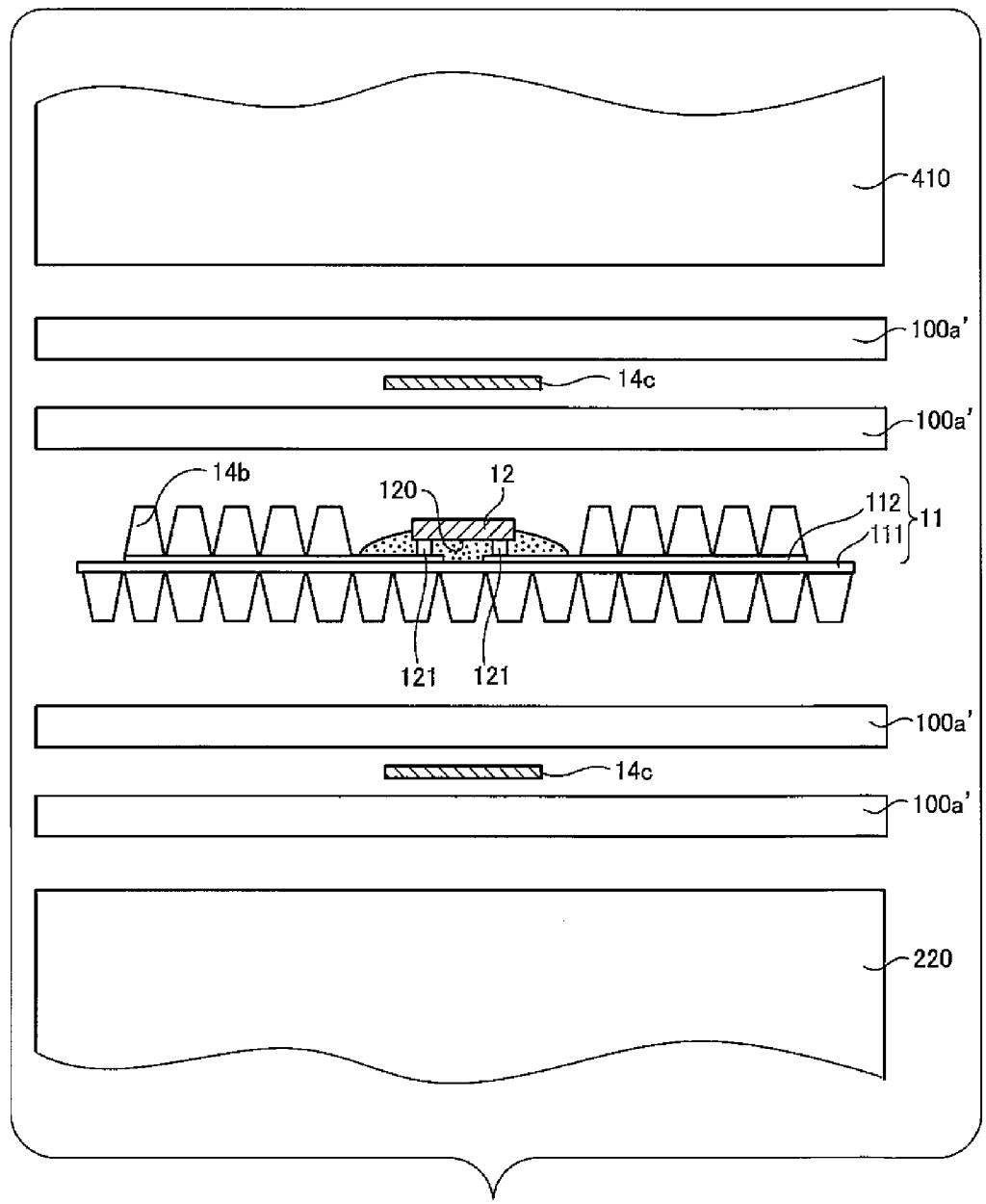
FIG. 7 is a view illustrating a process of embedding a chip reinforcement plate after the small convex portion has been attached to the base sheet in the method of manufacturing the RFID tag shown in FIG. 5.

FIG. 7 is a view illustrating a process of the method of manufacturing the RFID tag 20 shown in FIG. 5, where the chip reinforcement plates 14c are embedded after the small convex portions 14b have been attached to the base sheet 111.

After the formation of the small convex portion 14b, the process of embedding the chip reinforcement plates 14c is performed. In this step, two sets, each of which includes two sheets of plate-shaped rubber materials 100a' that are materials of the coat article 100a in FIG. 5 and one chip reinforcement plate 14c inserted between the two rubber materials 100a', are prepared, and the base sheet 111 on which the small convex portions 14b have been attached is placed between the two sets. Then, the two sets and the base sheet 111 are pressurized and simultaneously heated using the second heating head 410 and the heating stage 220. The heating allows the rubber materials 100a' to be melt so that the melt rubber materials 100a' are drawn into between the two neighboring small convex portions 14b, and the two chip reinforcement plates 14c are placed over and under the base sheet 111 on which the circuit chip 12 has been mounted, with each of the chip reinforcement plates 14c drawn into two sheets of rubber materials 100a'. After a predetermined period of time, the heating is paused, so that the rubber materials 100a' are cured. Then, the surplus of the rubber materials 100a' extending off the base sheet 111 in the width direction to both sides of the drawing as in part (g) of FIG. 4 is removed, which completes the RFID tag 20 as shown in FIG. 5.

In the method of manufacturing the RFID tag 20 shown in FIG. 5 as described above, the convex portions may be formed as shown in FIG. 5 only by attaching on the base sheet 111 the small convex portions 14b shaped like a truncated quadrangular pyramid whose bottom surface has been attached with the double-sided adhesive tape 140b, which makes an RFID tag have high durability against a bending stress.

Although a method is employed in the description with reference to FIG. 6 that the small convex portion 14b is attached on the base sheet 111 in forming the small convex portion 14b on the base sheet 111, the present invention is not limited thereto. For example, in the method of manufacturing the RFID tag according to the present invention, plate-shaped plastics, which is a material for forming the small convex portion 14b, may be attached on the base sheet 111, and then the truncated quadrangular pyramid of the small convex portion 14b may be formed.

Figure 8:
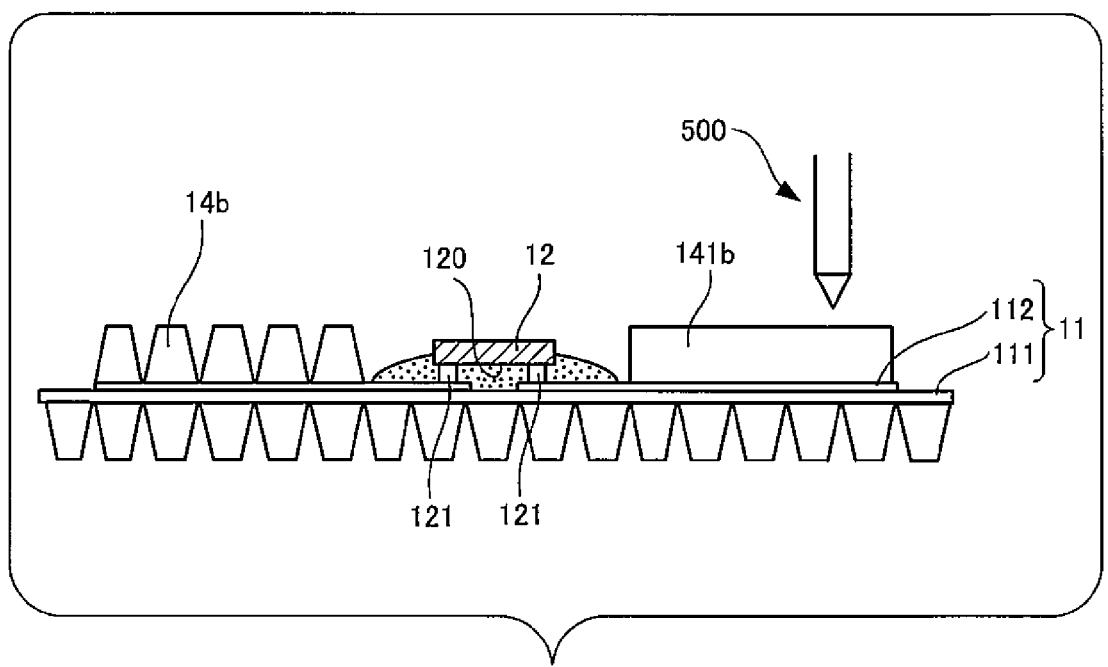
FIG. 8 is a view illustrating a process of forming the truncated pyramid shape of the small convex portion by attaching plate-shaped plastics, which is a material of the small convex portion, onto the base sheet and then treating a laser process on the plate-shaped plastics.
Figure 9:
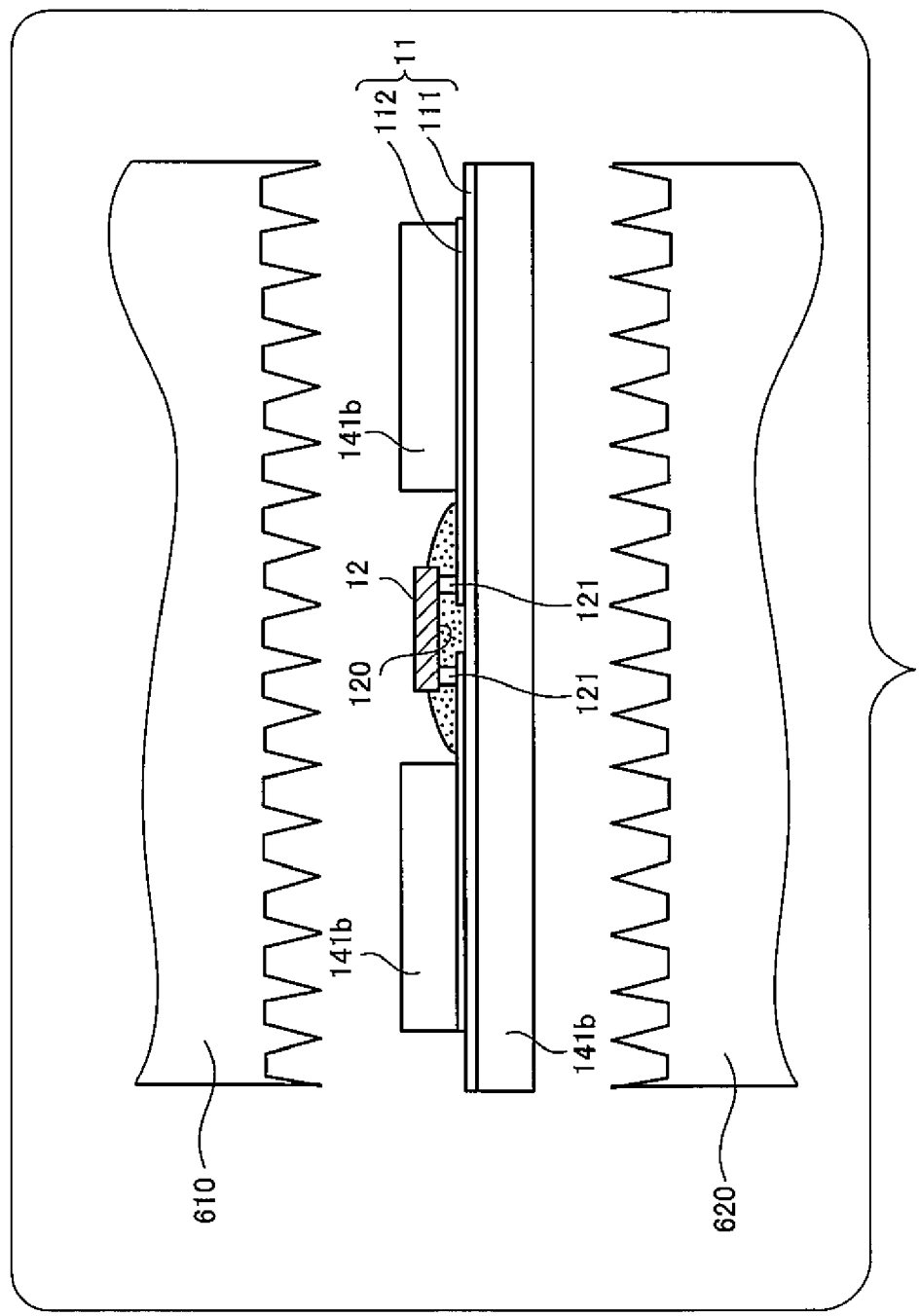
FIG. 9 is a view illustrating a process of forming the truncated pyramid shape of the small convex portion on the plate-shaped plastics by strongly pressurizing press mold heads.

FIG. 8 is a view illustrating a process of forming the truncated quadrangular pyramid of the small convex portion 14b by attaching the plate-shaped plastics, which is a material of the small convex portion 14b, on the base sheet 111 and then treating a laser process on the plate-shaped plastics. FIG. 9 is a view illustrating a process of forming the truncated quadrangular pyramid of the small convex portion 14b on the plate-shaped plastics by strongly pressurizing press mold heads 610 and 620.

In the process illustrated in FIG. 8, the plate-shaped plastics 141b, which are a material for the small convex portion 14b, are attached to the base sheet 111, and then is machined in the shape of the truncated quadrangular pyramid shown in FIG. 5 by a laser beam emitted from a tip of a laser illuminating device 500 toward the plate-shaped plastics 141b. This laser machining may have an advantage of providing high accuracy.

Instead of the laser machining, it is possible to form the shape of the truncated quadrangular pyramid as shown in FIG. 5 by pressurizing the plate-shaped plastics 141b located on the base sheet 111 with the press mold heads 610 and 620 as shown in FIG. 9. The method of pressurizing the plate-shaped plastics 141b located on the base sheet 111 with the press mold heads 610 and 620 to form the shape of the truncated quadrangular pyramid is somewhat poor in accuracy compared to the laser machining, but this method has a merit of increased productivity because of shorter processing time.

The exemplary embodiments of the present invention have been described as above.

Although a case where two chip reinforcement plates 14c are arranged over and under the circuit chip 12 has been described above, the present invention is not limited thereto. For instance, a single chip reinforcement plate 14c may be arranged only either over the circuit chip 12 or under the circuit chip 12, or another reinforcement member may be arranged to cover a side of the circuit chip 12 as well as over and under the circuit chip 12.

Although a case where the reinforcement body 14 includes the large convex portion 14a and the small convex portions 14b has been described above, each of which has a shape of a truncated quadrangular pyramid, the present invention is not limited thereto. For example, the large convex portion 14a and the small convex portions 14b of the reinforcement body 14 may be shaped like truncated pyramids other than the truncated quadrangular pyramid, or as a pyramid. In addition, each of the large convex portion and the small convex portion may be shaped like any one of a cone, a dome, and a pole.

What is claimed is:

1. An electronic apparatus comprising:
   a base sheet;
   a conductive pattern formed on the base sheet;
   a circuit chip mounted on the base sheet and connected to the conductive pattern; and
   a plurality of protrusions arranged on at least one of a frontside and a backside of the base sheet to overlap at least a portion of the conductive pattern, the plurality of protrusions protruding in a direction away from the base sheet,
   wherein the conductive pattern constitutes an antenna for wireless communication, and
   the circuit chip performs wireless communication through the antenna.

2. The electronic apparatus according to claim 1, wherein the plurality of protrusions are higher in rigidity than the base sheet.

3. The electronic apparatus according to claim 1, wherein the plurality of protrusions are a plurality of cone-like articles each of which has a bottom surface shaped like a polygon, and which are arranged such that the bottom surfaces are connected to one another.

4. The electronic apparatus according to claim 1, further comprising:
   a protection body which is broader than the circuit chip and narrower than the conductive pattern, and protects the circuit chip by being disposed on at least one of an upperside of the circuit chip and an underside of the circuit chip where the base sheet is interposed between the circuit chip and the protection body, wherein the plurality of protrusions are arranged at least on an area of surroundings of the protection body, the area being provided with the conductive pattern.

5. The electronic apparatus according to claim 1, wherein the plurality of protrusions are arranged on both the frontside and backside of the base sheet.

6. The electronic apparatus according to claim 1, further comprising a coat article in which the base sheet, the conductive pattern, the circuit chip, and the protrusions are contained.

7. A method of manufacturing an electronic apparatus comprising the steps of:

mounting a circuit chip on a base sheet on which a conductive pattern is arranged, and connecting the circuit chip to the conductive pattern; and arranging and forming a plurality of protrusions by arranging, in a direction away from the base sheet, the plurality of protrusions on at least one of a frontside and a backside of the base sheet on which the circuit chip is mounted, such that the arranged protrusions overlap at least a portion of the arranged conductive pattern, wherein the conductive pattern constitutes an antenna for wireless communication, and the circuit chip performs wireless communication through the antenna.

8. The method according to claim 7, wherein the step of arranging and forming the plurality of protrusions is a step in which a mold having a shape corresponding to a shape of the protrusions is placed on at least one of the frontside and the backside of the base sheet on which the circuit chip is mounted, a liquid material for the protrusions is poured between the base sheet and the mold, and the liquid material is cured, thereby forming the plurality of protrusions.

9. The method according to claim 7, wherein the step of arranging and forming the plurality of protrusions is a step in which a plate formed of a same material as the protrusions is placed on at least one of the frontside and the backside of the base sheet on which the circuit chip is mounted, and the plate is processed into the plurality of protrusions.

10. The method according to claim 7, wherein the step of arranging and forming the plurality of protrusions is a step of forming a plurality of protrusions which are higher in rigidity than the base sheet.

11. The method according to claim 7, wherein the step of arranging and forming the plurality of protrusions is a step of forming a plurality of cone-like articles each of which has a bottom surface shaped like a polygon, and which are arranged such that the bottom surfaces are connected to one another.

12. The method according to claim 7, further comprising the step of forming a protection body which is broader than the circuit chip and narrower than the conductive pattern, and protects the circuit chip by being disposed on at least one of an upperside of the circuit chip and an underside of the circuit chip where the base sheet is interposed between the circuit chip and the protection body, wherein the step of arranging and forming the plurality of protrusions is a step of arranging the plurality of protrusions at least on an area of surroundings of the protection body, the area being provided with the conductive pattern.

13. The method according to claim 7, wherein the step of arranging and forming the plurality of protrusions is a step of arranging the plurality of protrusions on both the frontside and backside of the base sheet.

14. The method according to claim 7, further comprising the step of forming a coat article which contains the base sheet, the conductive pattern, the circuit chip, and the protrusions.

* * * * *